US010319934B2

(12) United States Patent
Lee et al.

(10) Patent No.: US 10,319,934 B2
(45) Date of Patent: Jun. 11, 2019

(54) TRANSPARENT SUPPORTED ELECTRODE FOR OLED

(71) Applicant: SAINT-GOBAIN GLASS FRANCE, Courbevoie (FR)

(72) Inventors: Youngseong Lee, Seoul (KR); Jinwoo Han, Seoul (KR)

(73) Assignee: SAINT-GOBAIN GLASS FRANCE, Courbevoie (FR)

(*) Notice: Subject to any disclaimer, the term of this patent is extended or adjusted under 35 U.S.C. 154(b) by 299 days.

(21) Appl. No.: 15/305,529

(22) PCT Filed: Apr. 20, 2015

(86) PCT No.: PCT/FR2015/051069
§ 371 (c)(1),
(2) Date: Oct. 20, 2016

(87) PCT Pub. No.: WO2015/162367
PCT Pub. Date: Oct. 29, 2015

(65) Prior Publication Data
US 2017/0040565 A1 Feb. 9, 2017

(30) Foreign Application Priority Data

Apr. 22, 2014 (FR) ..................................... 14 53584

(51) Int. Cl.
*B32B 15/04* (2006.01)
*B32B 17/06* (2006.01)
(Continued)

(52) U.S. Cl.
CPC .......... *H01L 51/5212* (2013.01); *C03C 17/04* (2013.01); *C23C 14/086* (2013.01);
(Continued)

(58) Field of Classification Search
USPC ................ 428/426, 428, 432, 688, 701, 702
See application file for complete search history.

(56) References Cited

U.S. PATENT DOCUMENTS

2006/0154550 A1    7/2006  Nellissen
2009/0153972 A1*   6/2009  Nakamura .......... H01L 51/5268
                                                         359/599
(Continued)

FOREIGN PATENT DOCUMENTS

WO    WO 2005/053053 A1    6/2005
WO    WO 2011/089343 A1    7/2011
(Continued)

OTHER PUBLICATIONS

International Search Report as issued in International Patent Application No. PCT/FR2015/051069, dated Aug. 31, 2015.
(Continued)

*Primary Examiner* — Lauren R Colgan
(74) *Attorney, Agent, or Firm* — Pillsbury Winthrop Shaw Pittman LLP

(57) ABSTRACT

A supported transparent electrode for an OLED, includes, in succession: (i) a transparent substrate made of mineral glass; (ii) a scattering layer formed from a high-index enamel containing at least 30% by weight $Bi_2O_3$; (iii) a barrier layer of at least one dielectric metal oxide chosen from the group consisting of $Al_2O_3$, $TiO_2$, $ZrO_2$ and $HfO_2$, deposited by ALD; and (iv) a layer of a transparent conductive oxide (TCO).

13 Claims, 2 Drawing Sheets

(51) Int. Cl.
*H01L 51/52* (2006.01)
*C03C 17/04* (2006.01)
*C23C 14/08* (2006.01)
*C23C 16/40* (2006.01)
*C23C 28/04* (2006.01)
*H01L 51/00* (2006.01)
*H01L 51/56* (2006.01)

(52) U.S. Cl.
CPC ............ *C23C 16/403* (2013.01); *C23C 28/04* (2013.01); *H01L 51/0021* (2013.01); *H01L 51/0096* (2013.01); *H01L 51/5268* (2013.01); *H01L 51/56* (2013.01); *H01L 2251/306* (2013.01); *H01L 2251/558* (2013.01)

(56) References Cited

U.S. PATENT DOCUMENTS

| | | | |
|---|---|---|---|
| 2010/0079062 A1 | 4/2010 | Michels et al. | |
| 2011/0001159 A1* | 1/2011 | Nakamura | B82Y 20/00 257/98 |
| 2012/0194064 A1* | 8/2012 | Wada | C03C 3/066 313/504 |
| 2012/0194065 A1* | 8/2012 | Aoki | H01L 51/5268 313/504 |
| 2013/0026461 A1* | 1/2013 | Nakamura | H01L 51/5268 257/40 |
| 2013/0134407 A1* | 5/2013 | Wada | C03C 3/19 257/40 |
| 2013/0221336 A1* | 8/2013 | Allano | C03C 3/066 257/40 |
| 2014/0021460 A1* | 1/2014 | Tanida | H01L 51/5268 257/40 |
| 2014/0042415 A1 | 2/2014 | Park et al. | |
| 2014/0048790 A1* | 2/2014 | Tanida | H01L 51/5268 257/40 |
| 2014/0191223 A1* | 7/2014 | Wada | C03C 8/16 257/40 |
| 2014/0217390 A1* | 8/2014 | Nakamura | G02B 5/0242 257/40 |
| 2015/0144900 A1* | 5/2015 | Lee | H01L 51/5268 257/40 |
| 2015/0255753 A1* | 9/2015 | Zhou | C03C 17/04 428/143 |

FOREIGN PATENT DOCUMENTS

| | | |
|---|---|---|
| WO | WO 2013/117862 A1 | 8/2013 |
| WO | WO 2013/187735 A1 | 12/2013 |
| WO | WO 2013/187736 A1 | 12/2013 |
| WO | WO 2014/013183 A1 | 1/2014 |
| WO | WO 2014/128421 A1 | 8/2014 |

OTHER PUBLICATIONS

George, S. M., "Atomic Layer Deposition: An Overview," Chem. Rev. 2010, 110, pp. 111-131.

Leskelä, M., et al., "Atomic layer deposition (ALD): from precursors to thin film structures," Thin Solid Films 409 (2002), pp. 138-146.

* cited by examiner

TRANSPARENT SUPPORTED ELECTRODE FOR OLED

CROSS-REFERENCE TO RELATED APPLICATIONS

This application is the U.S. National Stage of International Application Serial No. PCT/FR2015/051069, filed Apr. 20, 2015, which in turn claims priority to French Application No. 1453584, filed Apr. 22, 2014. The contents of all of these applications are incorporated herein by reference in their entirety.

The present invention relates to a supported electrode intended to be used, preferably as an anode, in an organic light-emitting diode.

An organic light-emitting diode (OLED) is an optoelectronic device comprising two electrodes, at least one of which is transparent to visible light, and a thin-film multilayer comprising at least one light-emitting layer (LE layer). This light-emitting layer is sandwiched at least between, on the one hand, an electron injection or transportation layer (EIL or ETL) located between the LE layer and the cathode and, on the other hand, a hole injection or transportation layer (HIL or HTL) located between the LE layer and the anode.

OLEDs comprising a transparent electrode carrier and a transparent electrode making contact therewith are conventionally referred to as substrate-emitting OLEDs or bottom-emitting OLEDs. The transparent electrode is in this case typically the anode.

Analogously, OLEDs comprising an opaque electrode carrier are referred to as top-emitting OLEDs since the emission then occurs through the transparent electrode, generally the cathode, this electrode not making contact with the carrier.

Above a given potential threshold, the luminous power of an OLED depends directly on the potential difference between the anode and the cathode. To manufacture large OLEDs having a luminous power that is uniform over their entire area, the ohmic drop between current input terminals, which are generally located on the border of the OLEDs, and the centre of the OLED must be limited as much as possible. One known way of limiting this ohmic drop is to decrease the sheet resistance ($R_\square$ or $R_s$) of the electrodes, typically by increasing their thickness.

However, such an increase in electrode thickness poses significant problems when it is a question of transparent electrodes. Specifically, the materials used for these electrodes, for example ITO (indium tin oxide), have an insufficient light transmission and a prohibitive cost that means that thicknesses larger than 500 nm are not at all advantageous. In practice, ITO layers do not exceed about 150 nm.

It is well known to mitigrid or overcome this problem of the insufficient conductivity of ITO by lining the anode with a metal grid. Metal grids, for example grids made of copper or, more frequently, of an Mo/Al/Mo or Cr/Al/Cr trilayer (MAM grids, MAM standing for metal/aluminium/metal), are thus commonly used to limit the resistivity of transparent anodes made of ITO in electro-optical devices such as OLEDs (US 2006/0154550, US 2010/0079062, WO2005/053053).

Such metal grids are generally formed by depositing continuous thin metal films by cathode sputtering, which films are then patterned by photolithography, this patterning comprising a step of etching in an appropriate mixture of weak and strong acids, typically $H_3PO_4$, $HNO_3$ and $CH_3COOH$, in order to remove the metal in the apertures. A mixture of strong acids, such as aqua regia ($HCl+HNO_3$), generally used for etching ITO, may also be used. However, when the metal grid is on ITO, it is difficult to control the etching and prevent the surface of the ITO from being damaged.

When the Applicant has carried out such acid etching steps on substrates for OLEDs bearing internal extraction layers based on high-index enamels containing high bismuth contents, the Applicant has been unhappily surprised to observe, in the final product, high leakage currents and the progressive formation of dark spots (pinholes). Such leakage currents, which are a quite widespread problem in the field of OLEDs, are due to short-circuits in locations where the anode is locally too close to the cathode. They generally result from surface irregularities that have a non-negligible relief relative to the thickness of the organic film multilayer (ETL/LE/HTL).

Analysis by electron microscopy of substrates comprising IELs based on high-index enamels having high bismuth contents has shown that the origin of these surface irregularities is miniscule craters, due to the presence of air bubbles solidifying as they burst on the surface of the enamel layer during the formation of the latter by melting of a glass frit (see FIG. 1). These miniscule craters are limited in number and so small in size that any leakage currents, generated in the OLEDs manufactured on such substrates, should have remained within acceptable limits. It is therefore assumed that these craters are considerably hollowed out and enlarged during the etching because of the mediocre resistance to acids of enamels having high bismuth contents.

What is quite surprising is that this effect is not only observed when metal layers making direct contact with the high-index enamel of the internal extraction layer (IEL) are etched but also when the metal layer is deposited above the ITO (anode) layer. The same effect has also been observed, although more rarely, during the chemical etching of TCO layers (without metal grids) and has been attributed to insufficient protection of the zone of substantial relief (crater) by the (photoresist) mask.

Moreover, depositing, by cathode sputtering, barrier layers known to resist acids, such as layers of $TiO_2$, $SnO_2$, $SiO_2$, $Si_3N_4$ or silicon oxynitride (SiON), with thicknesses ranging from 20 to 150 µm, between the IEL and the anode, does not significantly decrease the leakage current and number of pinholes observed in OLEDs manufactured from these substrates.

FIG. 3 shows surface defects observed after acid etching of a metal layer deposited by magnetron cathode sputtering on an ITO anode (about 150 µm in thickness), itself deposited by magnetron cathode sputtering on a 100 nm-thick SiON barrier layer.

The present invention is based on the discovery that small defects (craters, FIG. 1) in the surface of enamel layers having high bismuth contents may be effectively protected against degradation caused by acid etching by means of a very thin layer of certain metal oxides, provided that this layer is formed by atomic layer deposition (ALD).

This thin protective layer must be located between the enamel scattering layer (IEL), on the one hand, and the metal grid of the anode, on the other hand. It will be formed under the anode, made up of the TCO and the metal grid, preferably directly on the enamel layer.

One subject of the present invention is therefore a supported transparent electrode for an OLED, comprising, in succession:

(i) a transparent substrate made of mineral glass;

(ii) a scattering layer formed from a high-index enamel containing at least 30% by weight $Bi_2O_3$;
(iii) a barrier layer of at least one dielectric metal oxide chosen from the group consisting of $Al_2O_3$, $TiO_2$, $ZrO_2$ and $HfO_2$, deposited by ALD; and
(iv) a layer of a transparent conductive oxide (TCO).

Other subjects of the invention are a process for manufacturing such a transparent electrode, comprising depositing the barrier layer by ALD, and an OLED (organic light-emitting diode) containing such a transparent electrode.

It will be noted that the transparent electrode such as defined above does not yet necessarily comprise a metal grid. Specifically, the Applicant envisages marketing a supported electrode, such as defined above, the TCO anode of which will be structured subsequently by etching and provided with a metal grid by the OLED manufacturer. In the step of acid etching of the TCO and during formation of the metal grid, which also involves an acid etching step, the protective layer deposited by ALD will effectively protect the bismuth-rich enamel from erosion by the acids and prevent pinholes from forming in the final OLED.

The present invention of course also relates to a complete transparent supported electrode that comprises, in addition to the above layers (i) to (iv), a metal grid intended to increase the conductivity of the electrode. This metal grid may be located under or on the TCO layer and must make direct electrical contact therewith.

In a first embodiment the transparent electrode of the present invention therefore comprises, in order:
a transparent substrate made of mineral glass;
a scattering layer formed from a high-index enamel containing at least 30% by weight $Bi_2O_3$;
a barrier layer of at least one dielectric metal oxide chosen from the group consisting of $Al_2O_3$, $TiO_2$, $ZrO_2$ and HfO, deposited by ALD;
a layer of a transparent conductive oxide (TCO); and
a metal grid making direct contact with the TCO layer.

In a second embodiment, the order of the last two layers is inverted relative to the first embodiment and the transparent electrode of the present invention comprises, in succession:
a transparent substrate made of mineral glass;
a scattering layer formed from a high-index enamel containing at least 30% by weight $Bi_2O_3$;
a barrier layer of at least one dielectric metal oxide chosen from the group consisting of $Al_2O_3$, $TiO_2$ and $ZrO_2$, deposited by ALD;
a metal grid making direct contact with the TCO layer; and
a layer of a transparent conductive oxide (TCO).

Figure 1:
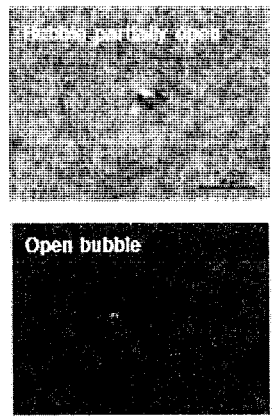
FIG. 1 shows two scanning electron microscope (SEM) micrographs of a partially open bubble (bubble partially open) and a completely open bubble (open bubble) on the surface of an enamel.

The substrate made of mineral glass may be any thickness compatible with the envisaged use, Conventionally, glass sheets having a thickness comprised between 0.3 and 5 mm and in particular between 0.7 and 3 mm are used. However, the use of ultra-thin glass sheets having smaller thicknesses, typically comprised between 50 nm and 300 nm, is also envisageable, providing that the mechanical problems involved with forming an enamel layer, in this case the high-index enamel layer, on glass sheets of such small thicknesses are solved.

The substrate is surmounted with a scattering layer formed from a high-index enamel containing at least 30% by weight $Bi_2O_3$. The expression "high-index" is here understood to mean an enamel having a refractive index (at $\lambda=550$ nm) at least equal to 1.7 and preferably comprised between 1.8 and 2.2.

The scattering layer (ii) plays the role of an internal light-extraction layer (IEL).

For a long time, in the field of OLEDs, it has been known that only a small fraction of the light produced by the light-emitting layer is emitted towards the exterior, through the transparent anode and the glass substrate. Specifically, as the optical index of the glass substrate ($n_{glass}=1.5$) is lower than that of the organic layers (n=1.7-1.8) and of the transparent anode (n=1.9 to 2.1), most (about 50%) of the light is trapped in these high-index layers as in a waveguide and absorbed after a certain number of reflections. An analogous effect occurs at the interface between the glass of the substrate ($n_{glass}=1.5$) and the surrounding air ($n_{air}=1.0$), trapping about 20% of the light emitted by the light-emitting layer.

It is known to decrease this trapping of the light (total internal reflection) in the high-index layers of an OLED by inserting, between the glass substrate and the transparent anode, a means for extracting light, for example formed by a high-index enamel containing scattering particles or by an interface that is rough enough to be scattering, which interface is planarized by a high-index enamel layer.

The expression "scattering layer" therefore encompasses in the present invention:
an enamel layer of high refractive index in which scattering elements are dispersed; and
a rough interface between two media of different indices, typically the surface of the glass having a relief of a certain roughness covered with a high-index enamel layer.

In one embodiment, the high-index enamel forming the scattering layer therefore contains elements that scatter light, dispersed through the thickness of the layer. These scattering elements have a higher or lower refractive index than the index of the enamel. In order to scatter light, these elements must be non-negligible in size relative to the wavelength of the light to be extracted, and are for example between 0.1 and 5 μm and preferably between 0.4 and 3 μm in size. These scattering elements may for example be solid particles added to the glass frit before it is melted, crystals formed when the frit is melted or even air bubbles formed during the step of melting the frit and trapped in the solidified enamel.

In another embodiment, the scattering effect results from the roughness of the interface between the high-index enamel (n≥1.7) and the underlying medium of lower index (glass substrate or low-index layer formed on the surface of the glass). The interface between the high-index enamel and the underlying medium of lower index (substrate) preferably has a roughness profile with an arithmetic mean deviation $R_a$ at least equal to 0.1 μm, preferably comprised between 0.2 and 5 μm and in particular between 0.3 and 3 μm.

In the case where an intermediate layer of low refractive index (n<1.6) is provided between the glass substrate and the enamel, for example a barrier layer protecting the high-index enamel from diffusion of alkali-metal ions originating from the substrate, it is the interface between this low-index layer and the high-index enamel that has the relief with this roughness profile.

Of course, it is possible to combine these two embodiments of the scattering layer, for example by introducing scattering elements, such as air bubbles, into a high-index enamel deposited on a rough glass surface, the essential point being that the upper face of the IEL must coincide with the upper face of the high-index enamel.

There are a number of glass compositions allowing high-index enamels to be obtained. The present invention particularly focuses on enamels having high bismuth contents, which have a quite low chemical resistance to acids, resulting in leakage currents and pinholes as explained in the introduction.

The high-index enamel of the present invention contains at least 30% by weight, preferably at least 50% by weight and in particular at least 65% by weight $Bi_2O_3$. These enamels are known and for example described in the international patent application WO2013/187736, and in the patent applications PCT/FR 2014/050370 and FR 1 360 522, in the name of the Applicant, which were still unpublished at the time of filing of the present application.

The high-index enamel for example contains from 55 to 84% by weight $Bi_2O_3$, as much as about 20% by weight BaO, from 5 to 20% by weight ZnO, from 1 to 7% by weight $Al_2O_3$, from 5 to 15% by weight $SiO_2$, from 5 to 20% by weight $B_2O_3$ and as much as 0.3% by weight $CeO_2$.

In the present invention a dielectric metal oxide layer (layer (iii)) is deposited by ALD (atomic layer deposition) on the high-index enamel described above. This deposition is preferably carried out directly on the surface of the high-index enamel. Atomic layer deposition is a well-known method of allowing extremely thin, uniform and impermeable layers to be formed.

A gaseous precursor, brought into contact with a surface, adsorbs thereon in the form of a monolayer by chemisorption or physisorption. After the precursor gas has been purged, a second gaseous component, capable of reacting with the adsorbed precursor, is admitted into the chamber. After the reaction, the chamber is purged again and the "adsorption-purge-reaction-purge" cycle may restart.

The table below gives a few examples of precursors and reactants allowing the dielectric metal oxides of the layer (iii) of the present invention to be formed.

| Dielectric metal oxide | Gaseous precursor | Gaseous reactant |
| --- | --- | --- |
| $Al_2O_3$ | $Al(CH_3)_3$ | $H_2O$ |
| $ZrO_2$ | Tetrakis(ethylmethylamino)zirconium $Zr[N(CH_3)(C_2H_5)]_4$ | $H_2O$ |
| $TiO_2$ | Tetrakis(dimethylamino)titanium $Ti[N(CH_3)_2]_4$ | $H_2O$ |

The reader may also refer to review articles such as the article by Markku Leskelä et al. "Atomic layer deposition (ALD): from precursors to thin film structures", Thin Solid Films, 409 (2002) 138-146 and the article by Steven M. George entitled "Atomic Layer Deposition: An Overview", Chem. Rev. 2010, 110, 111-131, which give many examples of precursor/reactant systems.

The barrier layer may be a simple layer consisting of a single metal oxide, or indeed a complex layer formed from a plurality of successive sublayers of various metal oxides, all deposited by ALD.

In one preferred embodiment of the present invention, the ALD barrier layer comprises a plurality of $Al_2O_3$ layers (n≈1.7) in alternation with layers of oxides of higher indices (n>2) preferably chosen from $TiO_2$, $ZrO_2$, and $HfO_2$. Specifically, aluminium oxide has the advantage of being very resistant to the strong acids, such as aqua regia, used to etch metals. However, its relatively low refractive index relative to that of the organic layers of the OLED and the optical loss that results therefrom prohibits the use of thick $Al_2O_3$ monolayers. By alternating $Al_2O_3$ layers with layers of $TiO_2$, $ZrO_2$ or $HfO_2$ it is possible to increase the overall thickness of the ALD layer without increasing optical losses.

The overall thickness of the ALD layer, whether it is simple or complex, is preferably comprised between 5 and 200 nm and in particular between 10 and 100 nm. When it is a question of a complex layer comprising in alternation sublayers of $Al_2O_3$ and sublayers of higher index, such as sublayers of $TiO_2$, $ZrO_2$ and $HfO_2$, the thickness of each of the sublayers is preferably comprised between 1 and 50 nm and in particular between 2 and 10 nm. The number of sublayers may be comprised between 2 and 200, preferably between 3 and 100 and in particular between 5 and 10. The number of $Al_2O_3$ sublayers is preferably comprised between 2 and 5 and it is in particular equal to 2 or 3.

In one preferred embodiment, the two external layers of the stack of sublayers are $Al_2O_3$ layers that ensure a good contact with adjacent materials.

Under an electron microscope, a layer of a dielectric metal oxide deposited by ALD may be easily differentiated from a layer deposited by cathode sputtering. It is characterized, as is known, by an extremely uniform thickness; a perfect continuity, even for small thicknesses; and by a high conformity to the relief of the underlying substrate, even over surfaces with a very pronounced relief.

The actual transparent electrode is located above the layer formed by ALD. This electrode is composed of a TCO layer, generally deposited by cathode sputtering, and a metal grid, these two structures making contact with each other. As explained above, the metal grid may be under the TCO layer—between the TCO layer and the ALD layer—or on the TCO layer.

The present invention is not particularly limited to certain grid structures or grid dimensions. The nature of the metal forming the grid is also not critical. It is however essential for the grid to be formed using a process comprising a step of acid etching a metal layer, typically through a mask. Specifically, as explained in the introduction, the Applicant has observed that it is this acid etching step that seems to be the root cause of the defects (leakage currents, pinholes) observed in the finished product. Processes for forming such grids by photolithography and acid etching are known.

Figure 4:
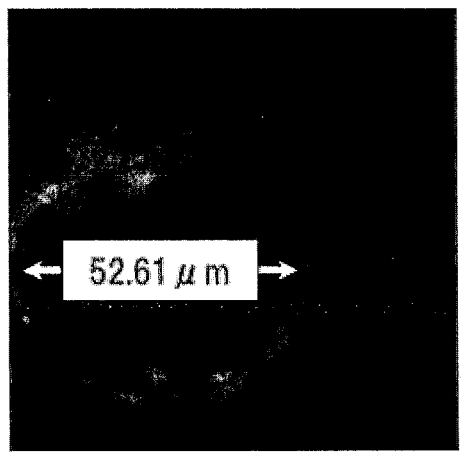
FIG. 4 shows pinholes in the form of hollowed-out craters.

The Applicant has, rarely, observed pinholes giving rise to leakage currents even when the OLED comprises no metal grid. Examination under electron microscope of the aspect of these pinholes has shown that they also evidently correspond to hollowed-out craters (see FIG. 4). The Applicant assumes that chemical etching of these surface defects takes place during the acid etching of the TCO layer in regions where the surface relief is too pronounced to be suitably protected by a thin (1 to 2 μm) layer of photoresist. Using a barrier layer deposited by ALD between the enamel of the IEL layer and the TCO effectively prevents this type of pinhole.

The TCO layer is deposited on the high-index enamel protected by the dielectric metal oxide layer by conventional deposition processes such as magnetron cathode sputtering, sol-gel processes or pyrolysis (CVD).

In principle, any transparent or translucent conductive oxide having a sufficiently high refractive index, close to the average index of the organic multilayer of an OLED (HTL/LE/ITL), may be used for this electrode layer. Mention may be made, by way of example of such materials, of transparent conductive oxides such as aluminium-doped zinc oxide (AZO), indium-doped tin oxide (ITO), tin zinc oxide (SnZnO) or tin dioxide ($SnO_2$). These materials advantageously have an absorption coefficient very much lower than that of the organic materials forming the HTL/LE/ITL multilayer, preferably an absorption coefficient lower than 0.005 and in particular lower than 0.0005. ITO will preferably be used. The thickness of the transparent conductive oxide layer is typically comprised between 50 and 200 nm.

The process for manufacturing a transparent supported electrode for an OLED, of the present invention, comprises at least the three following successive steps:
(a) providing a transparent substrate bearing, on one of its faces, a scattering layer formed from a high-index enamel containing at least 30% by weight $Bi_2O_3$;
(b) forming, by atomic layer deposition (ALD), on the high-index enamel and making direct contact therewith, a layer (barrier layer) of at least one dielectric metal oxide chosen from the group consisting of $Al_2O_3$, $TiO_2$, $ZrO_2$ and $HfO_2$; and
(c) forming a TCO layer on the dielectric metal oxide layer (b).

When the process according to the invention only comprises these three steps, an intermediate product (substrate/high-index enamel/ALD layer/TCO layer) is obtained that is intended to subsequently receive the metal grid.

The process for manufacturing a complete supported transparent electrode according to the invention will of course furthermore comprise an additional step (step (d)) of forming a metal grid making direct contact with the transparent conductive oxide layer, this step (d) comprising at least one step of acid etching.

This step of acid etching is carried out on a continuous metal layer covered with a mask created for example by screen printing or photolithography, the acid serving to remove the metal in certain zones not covered by the mask, so as to form the apertures of the grid.

The thickness of the metal layer, and therefore the height of the resulting grid, its about a few hundred manometers, typically from 0.5 to 1 μm and preferably from 0.6 to 0.8 μm. The width of the strands of the grid is generally comprised between 10 μm and about 100 μm.

In a first embodiment of the process according to the invention, step (d) is carried out after step (c) so that the metal grid makes contact with the TCO layer but not with the metal oxide barrier layer.

In a second embodiment, step (d) is carried out after step (b) and before step (c) so that the metal grid makes contact both with the dielectric metal oxide barrier layer and with the TCO layer.

The metal grid always forms a relief, because even when the TCO layer is deposited on the metal grid, as in the second embodiment, it is obvious, on account of the respective thicknesses of these two structures (0.05 to 0.2 μm for the TCO layer and 0.5 to 1 μm for the grid), that the TCO layer will not cover and planarize this relief.

In any case, the metal grid must therefore be covered with a passivating layer that of course leaves the apertures etched by the acid, which form the illuminated zones of the final OLED, unobstructed. The passivation of electrode grids with a passivating layer also forms part of the general knowledge of those skilled in the art of OLED manufacture.

Before the light-emitting layers are applied, the OLED substrate is advantageously covered in a known way with an organic hole injection material such as PEDOT/PSS (polyethylenedioxythiophene/poly(styrene sulfonate)) that allows the relief of the substrate described above to be planarized.

EXAMPLE

On a 0.7 mm-thick sheet of mineral glass, a high-index enamel layer was deposited by melting a glass frit having the following composition (in % by weight): 65% $Bi_2O_3$, 12.6% ZnO, 12.9% $SiO_2$, 2.6% $Al_2O_3$, and 6.9% $B_2O_3$.

A paste of glass frit in an organic medium (75% by weight frit, 22% by weight volatile organic solvent and 3% ethyl cellulose) was deposited by screen printing and dried (about 20 minutes at 130° C.); the ethyl cellulose was removed with a 20 minute-long heat treatment at 430° C. and then the frit was heated to 540° C. for 10 minutes. This melting step was carried out at atmospheric pressure which led many air bubbles to form in the enamel layer. The high-index enamel layer thus formed contained surface defects due to air bubbles solidifying as they burst.

FIG. 1 shows two scanning electron microscope (SEM) micrographs of a partially open bubble (bubble partially open) and a completely open bubble (open bubble) on the surface of the enamel.

Figure 2:
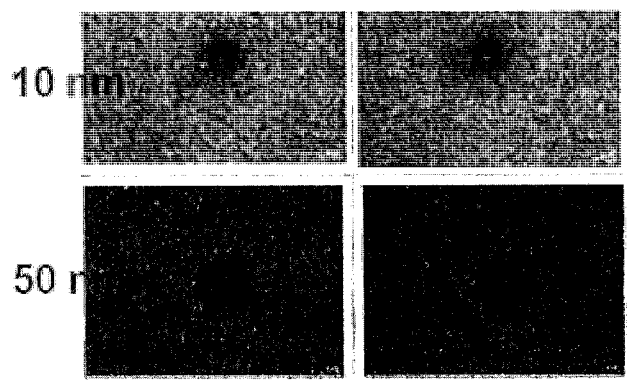
FIG. 2 shows, on the left, SEM micrographs of two surface defects (air bubbles having solidified as they burst) observed on the enamels protected by an ALD layer and, on the right, SEM micrographs of the same surface defects after the etching step.

Next, on two substrate samples bearing this high-index enamel, a layer of $Al_2O_3$ was deposited with a thickness of 10 nm and 50 nm, respectively. FIG. 2 shows, on the left, SEM micrographs of two surface defects (air bubbles having solidified as they burst) observed on these enamels protected by the ALD layer.

Next, the same substrates were subjected to a step of acid etching in a phosphoric acid solution of pH<1 for 100 seconds at a temperature of 45° C.

FIG. 2 shows, on the right, SEM micrographs of the same surface defects after the etching step. It may be seen that their aspect is strictly identical to that before the etching.

Figure 3:
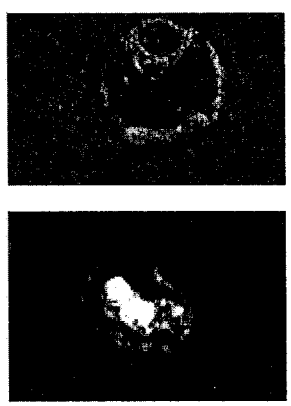
FIG. 3 shows two SEM micrographs of surface defects observed after acid etching.

By way of comparison, FIG. 3 shows two SEM micrographs of surface defects observed after acid etching (in a phosphoric acid solution of pH<1 for 100 seconds at a temperature of 45° C.) in a metal layer deposited on an ITO anode (about 150 μm-thick), itself deposited on a 100 nm-thick SiON barrier layer on an enamel of identical composition to above, the ITO anode and the barrier layer being deposited by magnetron cathode sputtering.

These defects (same magnification as FIG. 2) are considerably larger than the original air bubbles.

The invention claimed is:
1. Supported transparent electrode for an OLED, comprising, in succession:
(i) a transparent substrate made of mineral glass;
(ii) a scattering layer formed from a high-index enamel containing at least 30% by weight Bi2O3;
(iii) a barrier layer of at least one dielectric metal oxide chosen from the group consisting of Al2O3, TiO2, ZrO2 and HfO2, deposited by ALD; and
(iv) a layer of a transparent conductive oxide (TCO), wherein the barrier layer deposited by ALD comprises a plurality of Al2O3 layers in alternation with layers of oxides of higher indices (n>2) chosen from TiO2, ZrO2, and HfO2.

2. The electrode according to claim 1, further comprising a metal grid under or over the TCO layer and making direct contact therewith.

3. The electrode according to claim 1, wherein the barrier layer deposited by ALD is comprised between 5 and 200 nm in thickness.

4. The electrode according to claim 3, wherein the barrier layer deposited by ALD is comprised between 10 and 100 nm in thickness.

5. The electrode according to claim 1, wherein the high-index enamel forming the scattering layer contains elements that scatter light, dispersed through the thickness of the layer.

6. The electrode according to claim 1, wherein the interface between the high-index enamel and the underlying transparent substrate made of mineral glass has a roughness profile with an arithmetic mean deviation $R_a$ at least equal to 0.1 μm.

7. The electrode according to claim 6, wherein the arithmetic mean deviation $R_a$ is comprised between 0.2 and 5 μm.

8. The electrode according to claim 7, wherein the arithmetic mean deviation $R_a$ is comprised between 0.3 and 3 μm.

9. OLED comprising an electrode according to claim 1.

10. Process for manufacturing a supported transparent electrode for an OLED, comprising the following successive steps:

(a) providing a transparent substrate made of mineral glass bearing, on one of its faces, a scattering layer formed from a high-index enamel containing at least 30% by weight $Bi_2O_3$;

(b) forming, by atomic layer deposition (ALD), a dielectric metal oxide barrier layer that comprises a plurality of $Al_2O_3$ layers in alternation with layers of oxides of higher indices (n>2) chosen from $TiO_2$, $ZrO_2$, and $HfO_2$ on the high-index enamel layer, said dielectric metal oxide barrier layer making direct contact with the high-index enamel layer; and (c) forming a layer of a transparent conductive oxide (TCO) on the dielectric metal oxide barrier layer.

11. The process according to claim 9, further comprising a step (d) of forming a metal grid making direct contact with the transparent conductive oxide layer, this the step (d) comprising at least one step of acid etching.

12. The process according to claim 8, wherein the step (d) is carried out after step (b) and before step (c) so that the metal grid makes contact both with the dielectric metal oxide barrier layer and with the TCO layer.

13. The process according to claim 8, wherein the step (d) is carried out after step (c) so that the metal grid makes contact with the TCO layer but not with the dielectric metal oxide barrier layer.

* * * * *